United States Patent [19]

Ebbers et al.

[11] Patent Number: 5,001,672
[45] Date of Patent: Mar. 19, 1991

[54] VIDEO RAM WITH EXTERNAL SELECT OF ACTIVE SERIAL ACCESS REGISTER

[75] Inventors: Timothy J. Ebbers, Shokan; Satish Gupta, Peekskill; Randall L. Henderson, West Hurley, all of N.Y.; Nathan R. Hiltebeitel, South Burlington, Vt.; Robert Tamlyn; Steven W. Tomashot, both of Jericho, Vt.; Todd Williams, Essex Junction, Vt.

[73] Assignee: International Business Machines Corporation, Armonk, N.Y.

[21] Appl. No.: 352,802

[22] Filed: May 16, 1989

[51] Int. Cl.$^5$ .............................................. G11C 8/00
[52] U.S. Cl. .......................... 365/230.05; 365/230.04; 365/239
[58] Field of Search ...................... 365/189.05, 230.05, 365/230.09, 233, 239, 240

[56] References Cited

U.S. PATENT DOCUMENTS 4,825,411  4/1989  Hamano ........................... 365/233 X
4,855,959  8/1989  Kobayashi ......................... 365/239

Primary Examiner—Joseph A. Popek
Attorney, Agent, or Firm—W. A. Kinnaman; M. S. Walker

[57] ABSTRACT

An implementation of a serial access memory register facility which allows the external selection of the portion of the SAM to be scanned out. A control signal is provided which causes the reloading of serial access memory address counter causing the reloading of serial access memory address counter causing the serial scanning to shift from one to another of the serial access memory registers. The result is an ability to select a stopping point when scanning out of the serial access memory. Thus, the present invention implements the ability in a video random access memory to specify both the starting and ending points of the data to be scanned out of the serial access memory. The preferred embodiment replaces the QSF status pin with a control pin to preserve the packaging configuration of standard VRAMs.

11 Claims, 4 Drawing Sheets

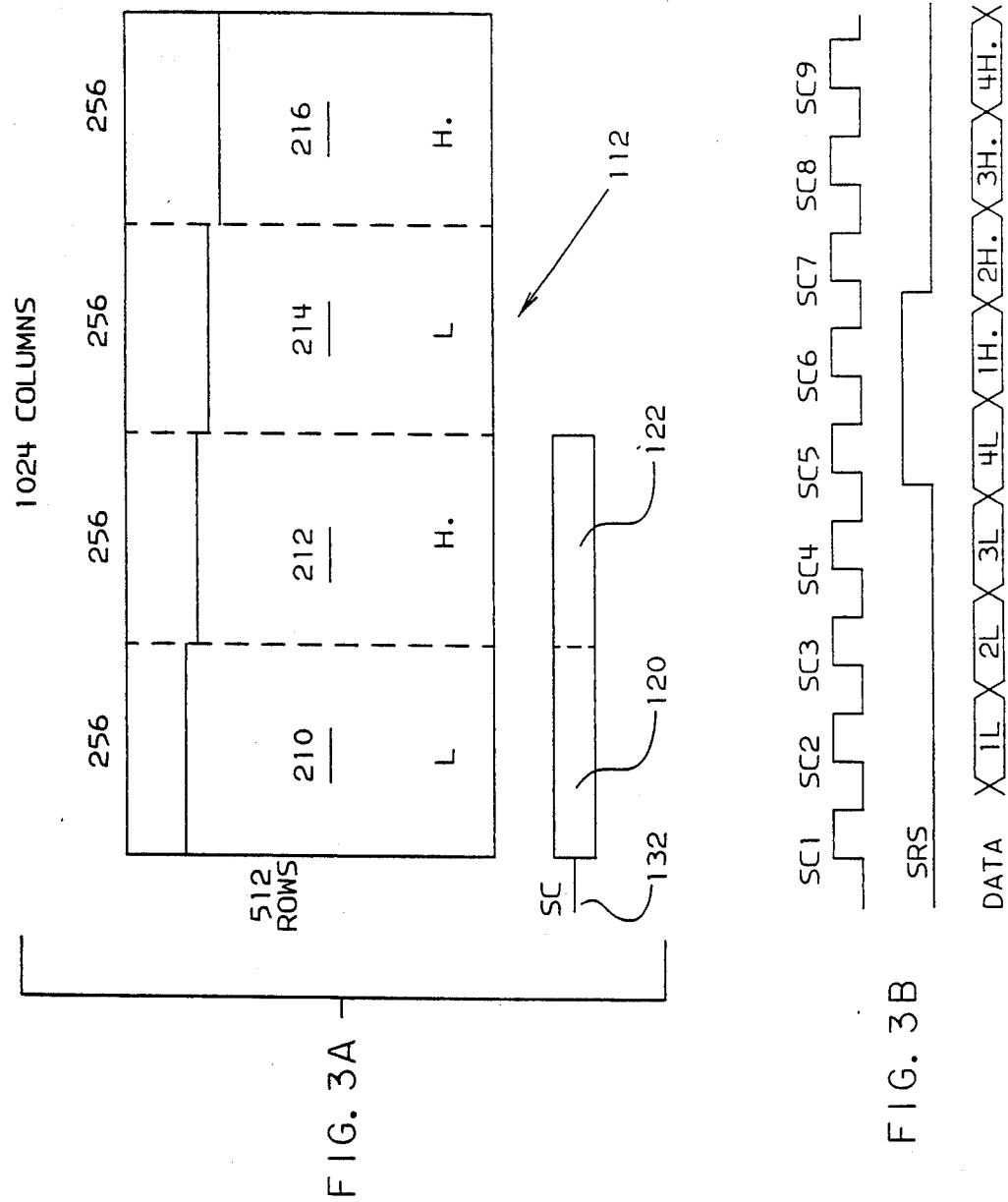

VIDEO RAM WITH EXTERNAL SELECT OF ACTIVE SERIAL ACCESS REGISTER

CROSS REFERENCE

This application is related to a patent application having Ser. No. 352,442, filed concurrently.

BACKGROUND OF THE INVENTION

1. Field of the Invention

The present invention relates to semiconductor memories, and more specifically to dual-ported memories including a memory array capable of being accessed randomly and a serial access register capable of serial data transfer to and from the memory. The dual-ported two-dimensional memory of this type is commonly referred to as a video RAM.

2. Background of the Invention

A dual-ported memory of the type discussed in this application is used, for example, for storing picture data to be input to a cathode ray tube. The picture data is randomly accessed to write or update the image in memory and then subsequently accessed serially to generate the image on the cathode ray tube. A memory of this type can store images captured by a video camera or other scanning device or it may be used to store images generated by a graphics ordering processing system.

The image to be displayed is divided into a number of discrete picture elements or pixels. Each pixel represents a physical position on the output display device and can have associated with it a color or specific shade of gray. In image and graphics systems the pixels of a display are each represented by a value stored in a memory device. This memory representation of a display is typically referred to as a frame buffer. A high resolution display, such as the IBM 5080 Graphics System, typically has an image of 1024×1024 or 1,048,576 pixels. Each pixel value can be represented by 1 to 24 or more bits thus requiring a large amount of memory to store the image. This requirement for large amounts of high speed memory (even by modern standards) leads to the use of the highest density memory parts available for graphic system devices. Typically, Dynamic Random Access Memories ("DRAMs") provide the highest memory density. The nature of video display scan patterns and update rates points to a need for even faster access times and a need to decouple the updating of the frame buffer from the scanning out of the stored values (through video generation circuitry) for display on a video monitor.

Video RAMs are a specialized form of Dynamic RAM memory. They are designed to solve the problem of simultaneously displaying the contents of a graphics frame buffer to the screen while allowing the graphics or image processor to update the frame buffer with new data. Video RAMs contain two Input/Output ports (one for random access and one for serial access) and one address port. These memories are frequently referred to as dual-port memories. In addition to the standard DRAM random access array of rows and columns, a Serial Access Memory ("SAM") register has been added to support serial input and output.

Video RAMs of this type are known in the prior art, for example U.S. Pat. No. 4,541,075 to Dill et al. describes such a memory device. The graphics or image processor updates the frame buffer by writing into the random access array. The serial access memory (SAM) register is designed to sequentially shift the contents of its buffer to the display independently of the random access array. The only time the random array and the SAM do not operate independently is when the SAM needs to be loaded with new data from the random array. The SAM is loaded by executing a special memory cycle called a Read Data Transfer which copies an entire row of the random array into the SAM. External controls allow the data to be sequentially clocked out of the SAM into circuitry which updates the video monitor. The clock rate of the SAM is typically between 3-4 times faster than a standard random access cycle.

Second generation VRAMs were enhanced with the ability to transfer half a row of random access memory into half of the SAM while the other half of the SAM is being scanned out to the display. This is known as a split row transfer. An output status pin known as QSF is typically provided to indicate the half of the SAM being scanned out.

Split row transfer solves the problems of close timing tolerances between the serial access memory and the Read Data Transfer process used to load the SAM. When a standard Read Data Transfer is done, a whole row is copied from the random array to the SAM. If this is done while the Serial Clock ("SC") is scanning data out of the SAM there are close timing requirements between the Data Transfer ("DT") pin and the SC pin to guarantee the desired switching point from old row data to new row data. Because of the speed of the Serial Clock and the asynchronous (independent) nature of the SAM, the proper control of the DT pin is difficult. Split row transfers are designed to solve this problem. While the serial clock is scanning out data from the low half of the SAM, a split row data transfer can occur in the upper half of the SAM and vice versa. The close timing coordination between SC and DT is no longer required. The operation between the SAM and the random array is almost completely decoupled.

During both a Read Data Transfer and a Split Read Data Transfer the row address selects the row (or part row) to transfer to the SAM. The column address is used as a starting address pointer, or tap pointer, in the SAM. This address indicates where the SAM will begin scanning out data. For Split Row Transfers, the second half of the SAM has a separate tap address. Present VRAMs start shifting out of the SAM at the tap address and switch to shifting out of the second half of the SAM only when the half SAM boundary is reached. The use of the tap addresses is described in the prior art, for example U.S. Pat. No. 4,825,411.

Split row transfer is a step toward decoupling the timing of the random access of the VRAM from the timing of the serial side of the VRAM. Present split row transfer mechanisms provide for selecting the starting point for shifting out data, but do not provide a means for selecting when to stop shifting out of one half of the SAM and begin shifting out of the other half of the SAM. For frame buffer organizations that break a VRAM row into multiple scan lines of the display, the utility of the Split Row Transfer is nullified. The only way to scan out only a part of the SAM after the starting address is to do a Read Data Transfer with the new row of data. The timing restrictions of DT and SC are then in effect. To make effective use of Split Row Transfer, a mechanism must exist to select the point at which the scanning of the SAM switches halves and begins at the second tap address. It is an object of the present invention to provide an ability to select this register switching point.

SUMMARY OF THE INVENTION

The present invention is directed to the implementation of a Serial Access Memory, SAM, register that facilitates external selection of the half of the SAM to be scanned out. A control pin will select which half of the SAM is active. While one half of the SAM is being scanned out a new portion of a row of data is loaded into the inactive half of the SAM. The preferred embodiment of the present invention replaces the function of the QSF pin, an output status pin, with Split Register Select (SRS) an input control pin. A level or transition of the SRS pin causes the SAM to stop scanning the present active half of the SAM and begin scanning the other half of the SAM beginning at the tap address. While the preferred embodiment will be described in terms of two halves of the SAM, the SAM can be divided into any number of subset portions and be similarly controlled.

BRIEF DESCRIPTION OF THE DRAWING

FIG. 3A is a schematic representation of VRAM memory, and FIG. 3B is a timing diagram illustrating the operation of the preferred embodiment of the present invention.

DETAILED DESCRIPTION OF THE PREFERRED EMBODIMENT

Figure 1A:
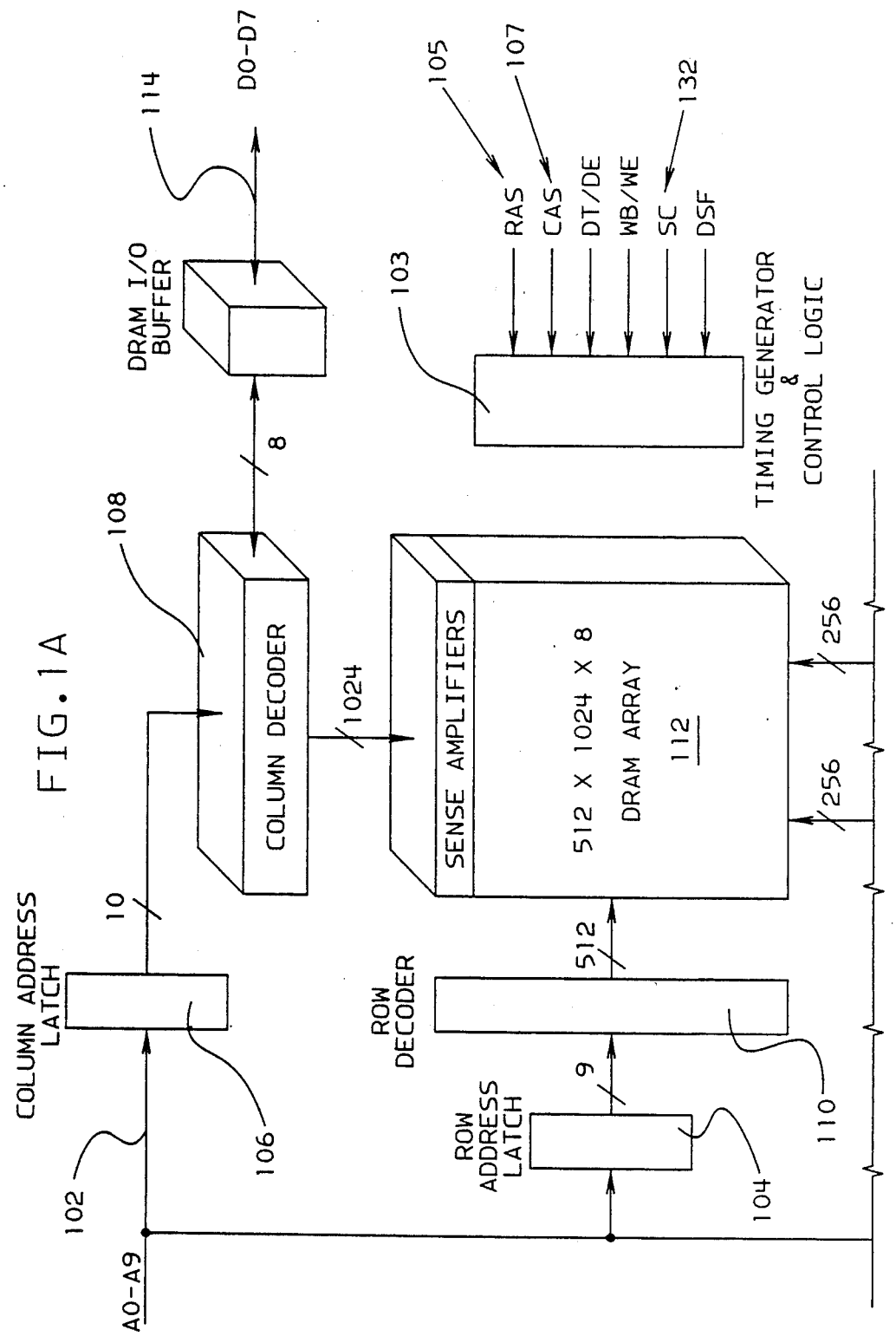
FIGS. 1A and 1B are a block diagram of a video RAM according to the present invention.

A VRAM is an enhanced DRAM. The DRAM portion of a VRAM operates in a manner similar to known DRAM devices The DRAM portion is shown in FIG. 1A. To save pins the addresses for rows and columns are multiplexed on address lines 102. Control signals RAS 105 and CAS 107 determine (via control logic 103) when to latch the address on the input pins into either the row address latch 104 or the column address latch 106. These latched addresses are decoded by column decoder 108 and row decoder 110 to point to one of the memory cells in the DRAM array 112. This cell is now selected to be read from or written to using, for example, the eight data Input/Output lines, D0-D7 114.

Figure 1B:
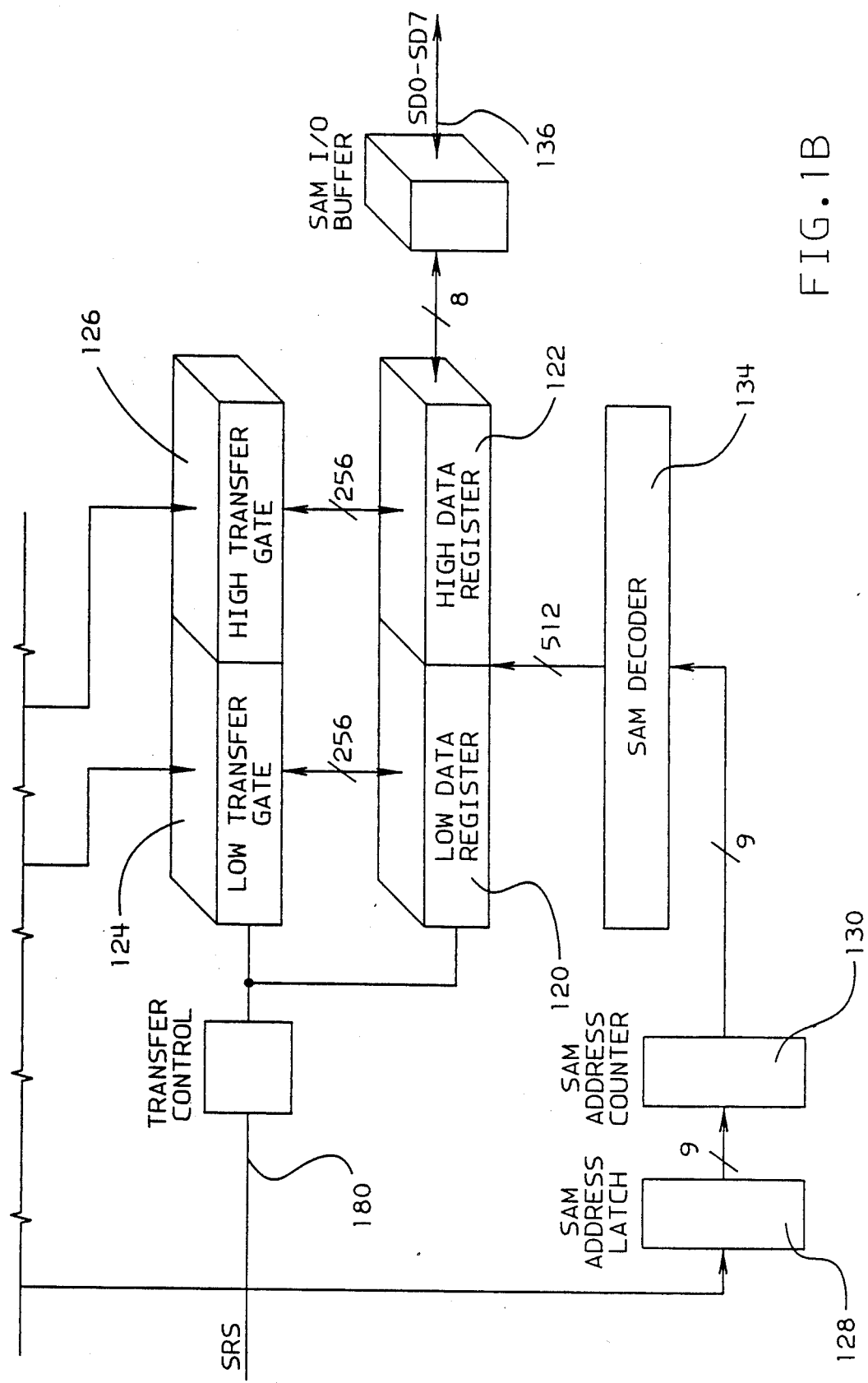

FIG. 1B shows the additional circuitry that makes a DRAM into a VRAM. The major elements of this circuitry are the Low and High Data Registers 120, 122, also known as the Serial Access Memory registers ("SAM"). In the preferred embodiment, a 4 Mbit VRAM, each 1024 element row is broken into two groups of 512 columns each. The selection of each group is done by the highest order bit of the latched column address 106. The SAM port is 512 columns wide and only connects to one group of columns at a time. (While 4 Mbit VRAMs are discussed, the invention is not constrained to any particularly density or organization of VRAM.)

Two pieces of circuitry are necessary to support the operation of the SAM. One is the transfer gates 124, 126. These gates are used to tie the selected row to the SAM register during a Data Transfer operation. A Data Transfer is a special VRAM cycle that transfers data between a row in DRAM array 112 to the SAM registers 120, 122. During the Data Transfer cycle the row address 104 is used to select which row to transfer. Since all the columns in a group will be transferred, the column address is not needed and is not latched. Instead the column address is latched into the SAM address latch 128 and is used as a starting address, or tap, for the SAM. The SAM is a sequential serial port so the addressing is generated by a counter. The SAM address latch is loaded into the SAM address counter 130 to set a starting address. Each subsequent Serial Clock cycle, SC 132, clocks the counter and points to the next register location (via SAM decoder 134) to supply data on the Serial data I/O lines, SD0-SD7 136.

One of the enhancements over first generation VRAMs is the ability to operate on half of the SAM independently from the other half. Second generation VRAMs have added another special cycle called a Split Data Transfer. This cycle breaks the 512 columns selected into two halves of 256 columns. Each half of 256 columns can be loaded into the SAM independent of the other half. Each half of the SAM also has its own tap address. Present VRAMs indicate which half of the SAM is actively being addressed by a status output QSF. Present VRAMs start at the tap address and continue incrementing until the boundary, e.g. at 255 or 511 is reached. At this point a new tap address is loaded from the SAM address latch and QSF switches (i.e. from high to low or vice versa).

A number of SAM Address Counter 130 configurations can be used to generate the SAM addresses. One such method is to have two 8-bit counters that each generate 256 addresses. One of the counters generates even addresses from 0 to 510. The second counter generates odd addresses from 1 to 511. The selection of the odd or even counter to supply the address is done by the 9th bit of the SAM address latch. A counter of this type is shown in FIG. 2.

Figure 2:
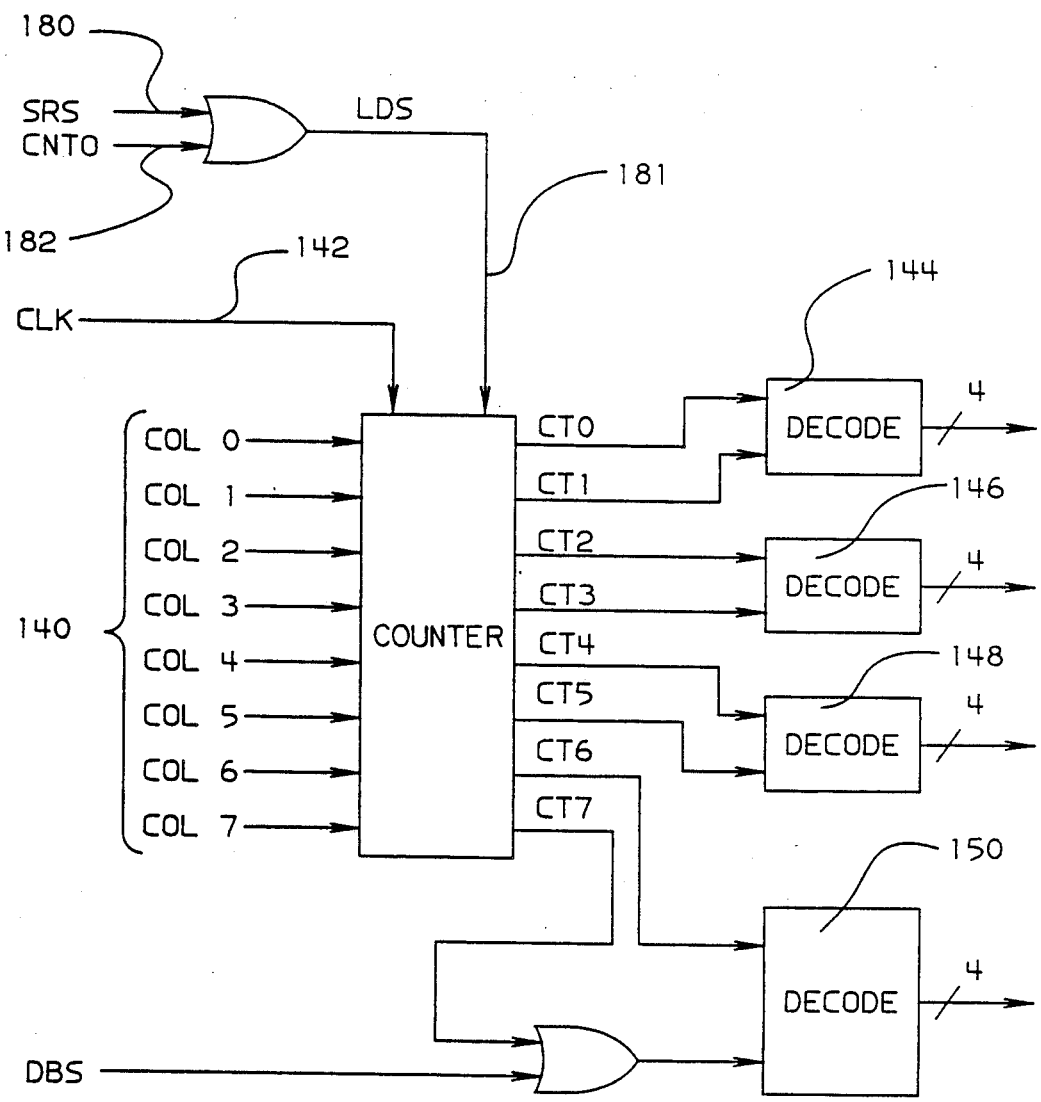
FIG. 2 is a block diagram illustrating one of the counters employed to implement the present invention.

The counter shown in FIG. 2 represents one of the two counters that would be used to generate the SAM addresses. The starting point or tap address from SAM address latch 128 is loaded into the counter to initialize the counter on lines 140. The counter is incremented by clock signal 142 generated by the control logic 103. Pre-decoders 144, 146, 148 and 150 each provide four bits to the next SAM address decode stage. While the preferred embodiment employs this form of dual counter, the present invention is in no way limited to implementation using this form of counter. For example, a single counter generating the full nine bit address could be employed as well.

The preferred embodiment of the present invention proposes to replace the QSF status output with an input control pin, SRS 180, Split Register Select. The present invention seeks to replace a pin rather than adding a new control pin due to packaging limitations which limit the total number of input and output pins available. The invention could be equally well implemented by simply adding an extra SRS control pin. Control over jumping to the tap address in the other half of the SAM register is implemented by using the SRS to control the loading of the SAM address counter 130. Signal LDS 181 causes the counter to be loaded with the data on lines 140. The present invention thus provides a means to select a stopping or switching point in the SAM before the end of the half SAM boundary is reached. In the preferred embodiment, the SRS signal is OR'ed with control signal CNT0 182 that causes the switch at the end of one half of the SAM. The OR indicates that if SRS is kept inactive during VRAM cycles that do not use the SRS function the VRAM will function as a prior art VRAM normally would function.

FIGS. 3A-3B are respectively a conceptual representation of the architecture and a timing diagram that shows the use of SRS. FIG. 3A shows the DRAM array 112 and the SAM registers 120 and 122. The DRAM array has been divided into four segments 210, 212, 214 and 216. Clock signal 132 is shown entering the SAM section. FIG. 3B is a timing diagram. The pulses of serial clock 132 are shown at the top with the high value shown as SC1, SC2, etc. The value of SRS signal 180 is shown in the middle of the bottom portion. The bottom portions labelled "data" indicates the data being transferred out of serial access memory on lines 136. Following pulse SC1, data byte 1 from the lower portion of the SAM register (1L) is being transferred. This is followed, for subsequent pulses of serial clock 132, by the transfer of data bytes 2L, 3L and 4L. Following serial clock pulse 4, SC4, SRS signal 180 changes from low to high value. This causes SAM counter 130 to be reloaded with a new tap address from SAM address latch 128 causing subsequent data to be output from the high data register 122. Thus following the serial clock pulses 5, 6, et seq. the data output is 1H, 2H, etc. As shown in FIG. 3B, the preferred embodiment does not require SRS signal 180 to maintain a high value. The jumping or reloading of the counter occurs based upon a change in the SRS signal from low to high value. Once the address loading has occurred, SRS may be returned to low value at any time. A shift from the high data register to the low data register could be caused by again bringing SRS 180 to a high value.

In the above described embodiment, data is selected as a portion of one row among the rows of the DRAM array for transfer to the serial access memory. However, the data may be selected as a portion of a column to be transferred to the serial access memory with the same effects as described above. Furthermore, the data has been described as a specific portion of one row or one column, but it may be divided into a larger or smaller number of portions than that described herein. For example, while the present invention loads ¼ of one row into ½ of a serial access memory, in other embodiments, ½ of a row or ⅛ of a row may be loaded. Furthermore, an additional number of serial access registers could be employed instead of the two shown in the present embodiment. Thus more than two serial access memories may be provided with the same effects as described above.

We claim:

1. A dual-port memory comprising:
   a memory array having a plurality of memory elements each of which is accessed at random by a row and column address input to enable writing into or reading out of data at said row and column location;
   a plurality of serial access memory means each selectively accessing a specified portion of the data of a row or column of said memory elements in parallel, and each of which is selectively directed to an output port through which said specified portion of data is serially output in synchronism with a clock signal;
   address latch means for receiving an external tap address indicating the first element of said specified portion of data to be output from one of said serial access memories;
   address counter means for generating address signals to cause data to be serially output from a current one of said serial access memory means, wherein said address counter means is initialized with the address in said address latch means, and wherein said address counter means increments said address in response to said clock signal to access successive elements in said current one of said serial access memory means beginning with said first element corresponding to said tap address; and
   external signal means connected to said address counter means and operable prior to the accessing of all of the elements of said current one of said serial access memory means following said first element for causing said address counter means to load a new initial address from said address latch means, said new initial address indicating a first element in a different one of said serial access memory means, whereby said serial output from said current one of said serial access memory means terminates and serial output begins from said different one of said serial access memory means.

2. The dual-port memory of claim 1 wherein said address latch means is connected to said column address input and wherein said external tap address is placed on said column address input when a serial data transfer is specified.

3. The dual-port memory of claim 1 comprising two serial access memory means each having one half the number of memory elements in a row of said memory array.

4. The dual-port memory of claim 1 comprising two serial access memory means each having one quarter the number of memory elements in a row of said memory array.

5. A method for serially accessing data from a semiconductor memory array having elements arranged in rows and columns, said method comprising the steps of:
   decoding a row address to select a row of memory element;
   transferring a first portion of the elements in said selected row to a first serial access memory register;
   loading a first tap address into a serial access address latch pointing to a location in said first register;
   transferring a second portion of the elements in said selected row to a second serial access memory register;
   controlling said first serial access memory register to begin shifting the data stored in said register to serially output said data beginning at said first tap address;
   loading a second tap address into said serial access address latch pointing to a location in said second register;
   signaling said serial access memory counter prior to the completion of said serial output operation from said first register to load said second tap address thereby causing control to shift to said second register to begin shifting the data stored in said register to serially output said data beginning at said second tap address; and
   repeating said loading and signaling steps, alternating between said first and second registers, to serially output row data from a tap address to the point of signaling in each register.

6. The method of claim 5, wherein said step of signaling further comprises the step of:

externally generating a signal for signaling said serial access memory to load a subsequent tap address.

7. A dual-port memory comprising:
a memory array having a plurality of memory elements each of which is accessed at random by a row and column address input to access data at said row and column location;
a plurality of serial access memory registers each selectively accessing a specified portion of the data of a row or column of said memory elements in parallel, and each of which is selectively directed to an output port through which said specified portion of data is serially output in synchronism with a clock signal;
address latch means for generating address signals to cause data to be serially output from a current one of said registers, wherein said address counter means is loaded with an initial address, and wherein said address counter means increments said address in response to said clock signal to access successive elements in said current register beginning with said initial address; and
external signal means connected to said address counter means and operable prior to the accessing of all of the elements of said current register following said initial address for causing said address counter means to load a new initial address from said address latch means, said new initial address indicating a first element in a different one of said registers, whereby said serial output from said current register terminates and serial output begins from said different one of said registers.

8. A dual-port memory comprising a random access memory array having a plurality of rows and columns and respective locations corresponding to the intersections of said rows and columns, each of said rows comprising a plurality of portions having equal numbers of columns, means for coupling the location corresponding to a row address input and a column address input to a first port, a serial access memory register having columns corresponding to the columns of one of said portions of said array, parallel transfer means for transferring data in parallel between a selected portion of a selected row of said memory array and said register, and means for transferring data serially between said register and a second port.

9. A dual-port memory as in claim 8 in which said parallel transfer means selects a row of said array in accordance with a row address input and selects a portion of said row in accordance with a column address input.

10. A dual-port memory as in claim 9 in which said parallel transfer means selects said portion of said row in accordance with the most significant bit of said column address input.

11. A dual-port memory as in claim 8 in which each row contains a first plurality of portions, said memory comprising a second plurality of registers that is a submiltiple of said first plurality.

* * * * *